(12) United States Patent
Araoka

(10) Patent No.: US 6,218,694 B1
(45) Date of Patent: Apr. 17, 2001

(54) SEMICONDUCTOR MEMORY DEVICE AND METHOD FOR MANUFACTURING SAME

(75) Inventor: Keishi Araoka, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/338,512

(22) Filed: Jun. 23, 1999

(30) Foreign Application Priority Data

Jun. 25, 1998 (JP) .................................................. 10-178312

(51) Int. Cl.$^7$ ...................................................... H01L 29/72
(52) U.S. Cl. .......................... 257/296; 257/355; 257/372; 257/379; 257/386; 257/394; 257/401; 257/773
(58) Field of Search .................................... 257/296, 355, 257/372, 379, 386, 394, 401, 773

(56) References Cited

U.S. PATENT DOCUMENTS 5,998,846 * 12/1999 Jan et al. .............................. 257/379

FOREIGN PATENT DOCUMENTS

| 57-49254 | 3/1982 | (JP) . |
| 60-200541 | 10/1985 | (JP) . |
| 61-133664 | 6/1986 | (JP) . |
| 62-89342 | 4/1987 | (JP) . |
| 8-7002 | 3/1996 | (JP) . |
| 10-27853 | 1/1998 | (JP) . |

* cited by examiner

Primary Examiner—Edward Wojciechowicz
(74) Attorney, Agent, or Firm—Sughrue, Mion, Zinn, Macpeak & Seas, PLLC

(57) ABSTRACT

In a semiconductor memory device has a first contact region that is provided with a plurality of contacts in the source/drain region on one side of a third interconnect, and a second contact region that is provided with a plurality of contacts in the source/drain region on the other side of the third interconnect. The source region is connected via the contacts of a first contact region to the first interconnect, and the drain region is connected via the contacts of the first contact region to the second interconnect. An interconnect layer having a resistance value that is lower than the source/drain region is provided below the third interconnect, along the source/drain region, the source region of the first contact region and the source region of the second contact region being connected by this interconnect layer that has a lower resistance value than the source region, and the drain region of the first contact region and the drain region of the second contact region being connected by the interconnect layer having a lower resistance than the drain region.

3 Claims, 11 Drawing Sheets

SEMICONDUCTOR MEMORY DEVICE AND METHOD FOR MANUFACTURING SAME

BACKGROUND OF THE INVENTION

1. Field of the Invention

The present invention relates to a semiconductor memory device, and more particularly to a semiconductor memory device with improved degree of integration and a reduced effect from parasitic resistances in the source and drain regions.

2. Description of the Related Art

FIGS. 12,13 and FIG. 14 show a semiconductor memory device of the past, FIG. 12 showing the upper interconnect layer, FIG. 13 showing the cross-section view thereof, and FIG. 14 showing the condition in which the above-noted upper interconnect layer is removed.

In the above-noted drawings, the reference numeral 101 denotes a p-channel source/drain region, 111 is a source region within the source/drain region 101, 112 is a drain region, and 113 is a gate. The upper layer aluminum interconnect 103a is connected to the source region 111 via a plurality of contacts 105. The upper layer interconnect 103b is connected to the drain region 112 via a plurality of contacts 115. However, as shown in FIG. 12, because of the existence of the interconnect 103c, which is provided on the same layer as the upper layer interconnects 103a and 103b, and which is provided so as to cross over the source region 111 and the drain region 112, there are cases in which it is possible to make contact between the source and drain regions and the upper layer interconnect over only approximately 50% or less of the total gate width W, and in such cases because the resistance value of the source and drain region diffusion layers is high, if the overall gate width W becomes large, the region 117 in the drawing, this being a transistor at the edge of the source/drain region, exhibits a significant loss of capacity as a transistor, leading to the problem of a loss of writing speed.

While a proposed semiconductor device with reduced influence from parasitic resistance in the drain region is disclosed in the Japanese Unexamined Patent Publication (KOKAI) No.62-89342, according to this disclosure a plurality of contacts are provided for the purpose of reducing the resistance value of the source or the drain, and a semiconductor integrated circuit is shown in which these contacts are connected by a wire having a small resistance value. Thus, the problem being solved and the constitution of this disclosure are not the same as the present invention.

Other examples of prior art include the Japanese Unexamined Patent Publication (KOKAI) No.8-70002, according to which a backed interconnect technology reduces the interconnect resistance, and the Japanese Unexamined Patent Publication (KOKAI) No.60-200541, according to which upper and lower polysilicon films are connected via a single contact hole, so as to increase the degree of integration. However, these disclosures are also different from the present invention in terms of problem to be solved and constitution.

Accordingly, it is an object of the present invention to improve on the above-noted drawbacks in the prior art, by providing a semiconductor memory device which reduces the influence of parasitic resistance in the source and drain regions, and increases the degree of integration.

SUMMARY OF THE INVENTION

In order to achieve the above-noted objects, the present invention adopts the following basic technical constitution.

Specifically, the first aspect of a semiconductor memory device according to the present invention is a semiconductor memory device that has a source region formed in the shape of a band, a drain region formed in the shape of a band in opposition to the source region, a first interconnect which is provided in a layer above the source region and which makes connection thereto, a second interconnect which is provided in a layer above the drain region and which makes connection thereto and which is provided on the same layer as the first interconnect, and a third interconnect, which is provided on the same layer as the first and second interconnects and which is provided so as to laterally cross the source and drain regions, this semiconductor memory device further having a first contact region that is provided with a plurality of contacts in the source/drain region on one side of the third interconnect, and a second contact region that is provided with a plurality of contacts in the source/drain region on the other side of the third interconnect. The source region is connected via the contacts of the first contact region to the first interconnect, and the drain region is connected via the contacts of the first contact region to the second interconnect. An interconnect layer having a resistance value that is lower than the above-noted source/drain region is provided below the third interconnect, along the source/drain region, the source region of the first contact region and the source region of the second contact region being connected by an interconnect layer having a lower resistance value than the source region, and the drain region of the first contact region and the drain region of the second contact region being connected by an interconnect layer having a lower resistance than the drain region.

The second aspect of a semiconductor memory device according to the present invention is a semiconductor memory device that has a source region formed in the shape of a band, a drain region formed in the shape of a band in opposition to the source region, a first interconnect which is provided in a layer above the source region and which makes connection thereto, a second interconnect which is provided in a layer above the drain region and which makes connection thereto and which is provided on the same layer as the first interconnect, and a third interconnect, which is provided on the same layer as the first and second interconnects and which is provided so as to laterally cross the source and drain regions, this semiconductor memory device further having a first contact region that is provided with a plurality of contacts in the source/drain region on one side of the third interconnect, and a second contact region that is provided with a plurality of contacts in the source/drain region on the other side of the third interconnect. The source region is connected via the contacts of the first contact region to the first interconnect, and the drain region is connected via the contacts of the second contact region to the second interconnect. An interconnect layer having a resistance value that is lower than the above-noted source/drain region is provided below the third interconnect, along the source/drain region, the source region of the first contact region and the source region of the second contact region being connected by an interconnect layer having a lower resistance value than the source region, and the drain region of the first contact region and the drain region of the second contact region being connected by an interconnect layer having a lower resistance than the drain region.

In the third aspect of a semiconductor memory device according to the present invention, a plurality of the above-noted contact regions are provided, these contact regions each being connected by an interconnect layer that has a resistance value lower than the source/drain region.

DESCRIPTION OF THE PREFERRED EMBODIMENTS

Figure 1:
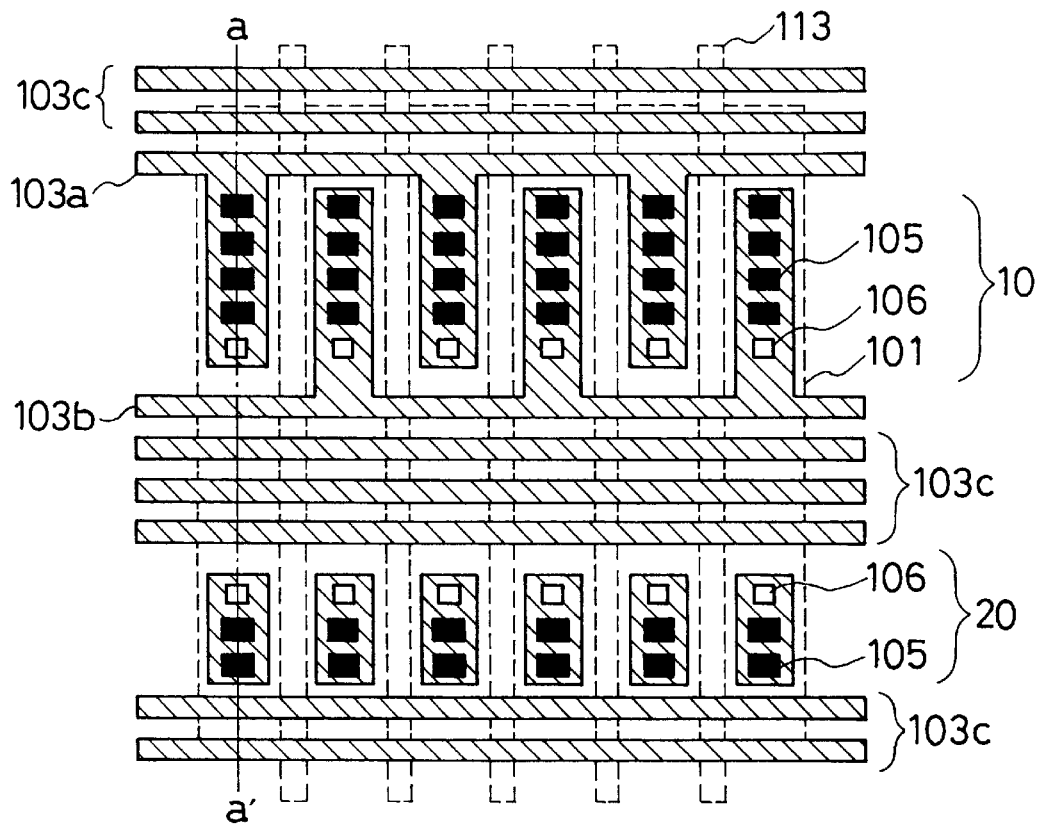
FIG. 1 is a plan view of a first embodiment of a semiconductor memory device according to the present invention, that shows the condition of the upper interconnect layer thereof.

Embodiments of a semiconductor memory device according to the present invention are described in detail below, with references being made to relevant accompanying drawings.

In the drawings that show embodiments of the present invention, elements that correspond to elements of the prior art are assigned the same reference numerals as used in the drawing of the prior art.

Figure 2:
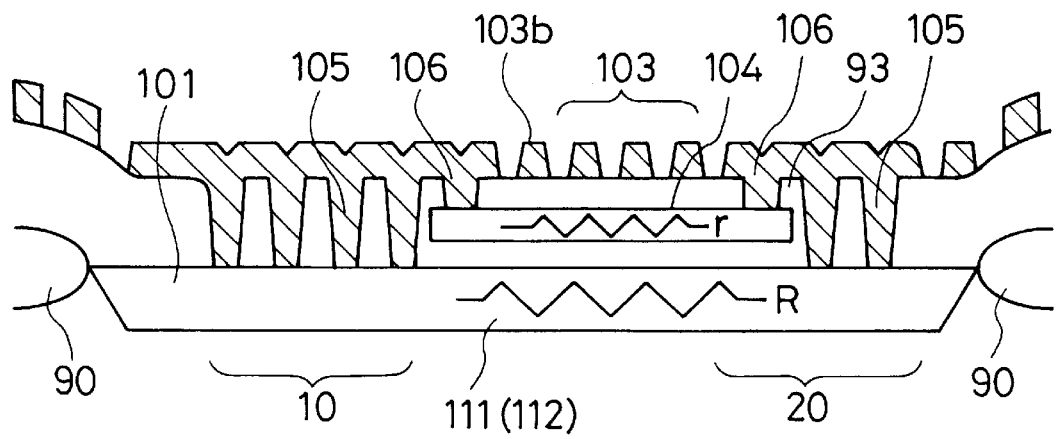
FIG. 2 is a cross-section view of a first embodiment.
Figure 3:
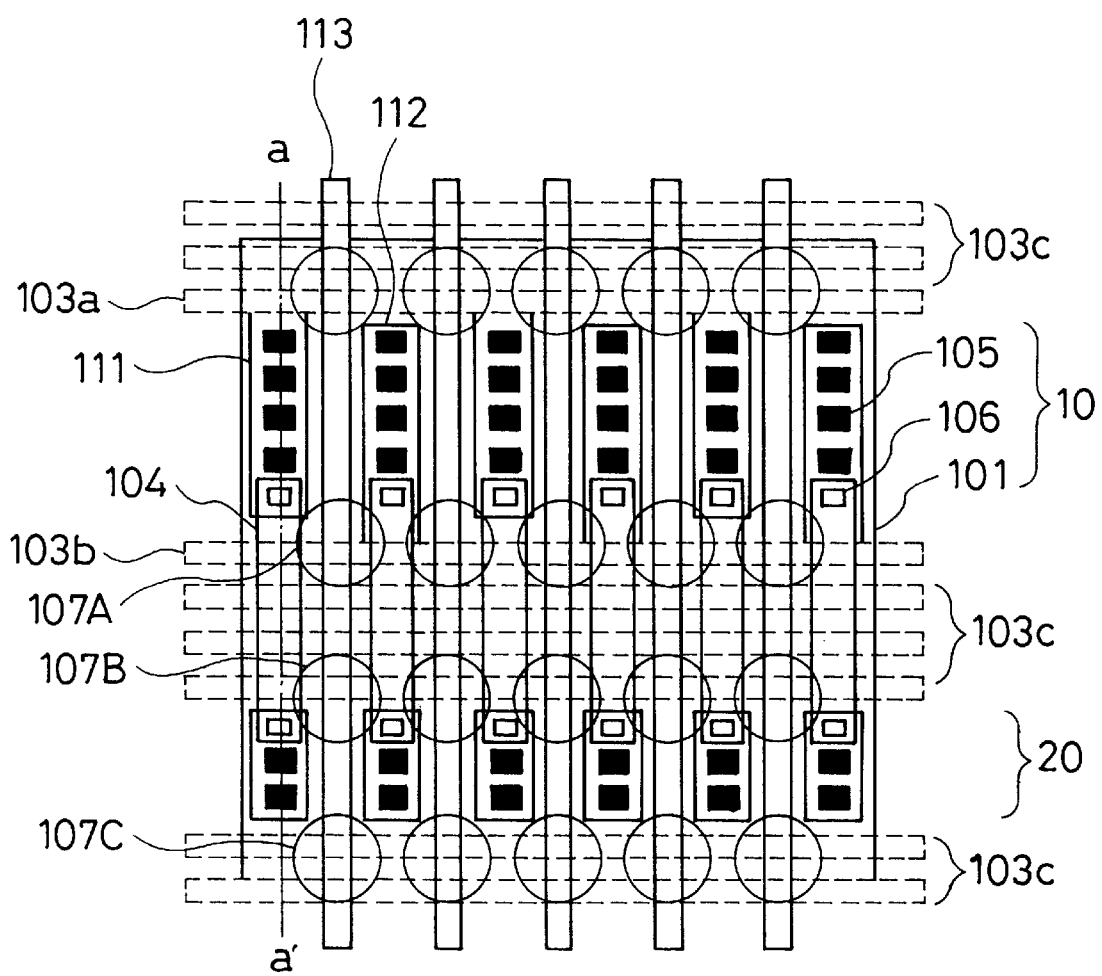
FIG. 3 is a drawing that shows the condition of the present invention with the upper interconnect layer of FIG. 1 removed.
Figure 4:
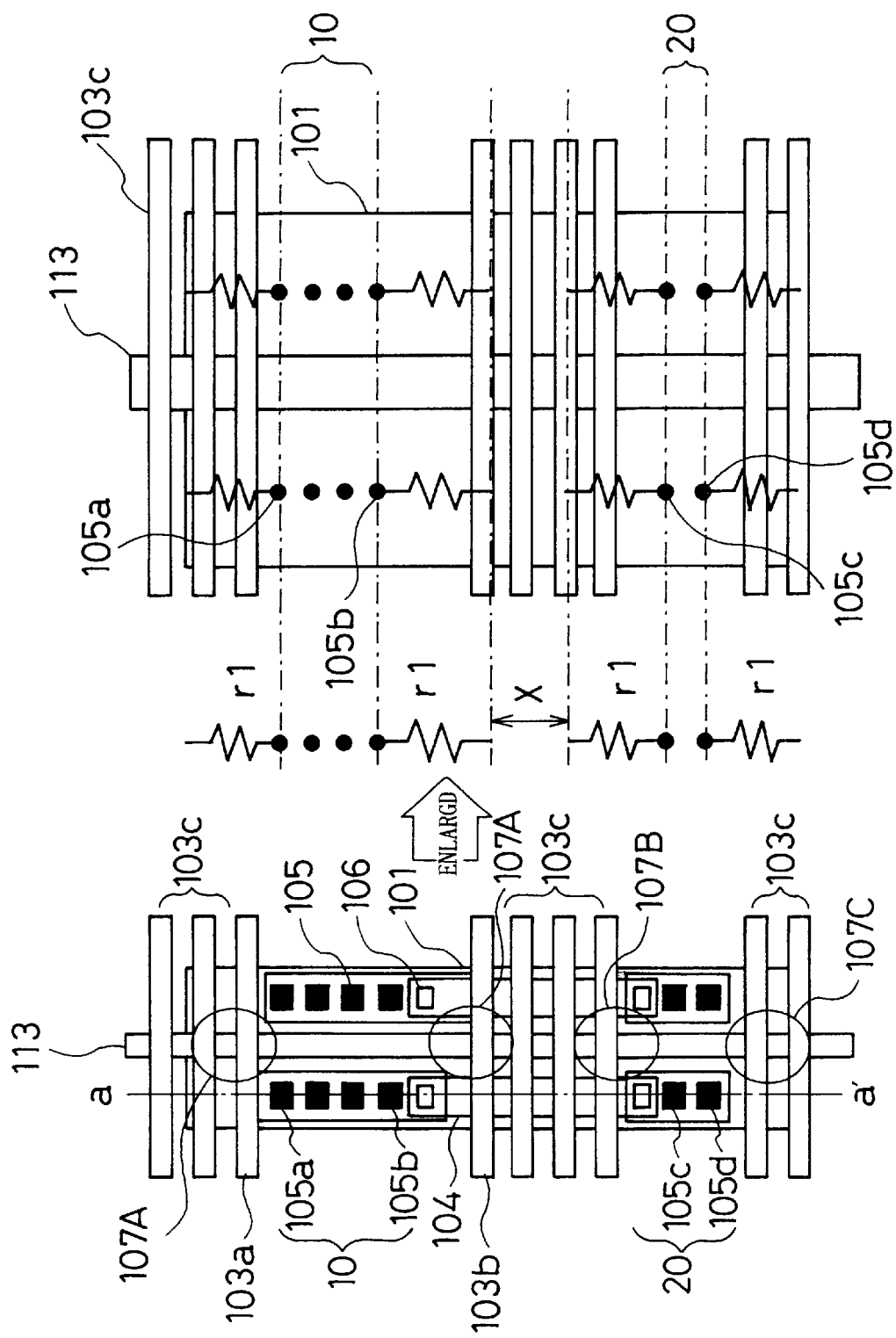
FIG. 4 is a drawing that illustrates the operation of the first embodiment of the present invention.

FIG. 1 to FIG. 4 show the structure of an example of the first embodiment of a semiconductor memory device according to the present invention, FIG. 1 being a plan view that shows the condition of the upper interconnect layer thereof, and FIG. 2 being a cross-section view along the cutting line a—a. FIG. 3 is a drawing that shows the condition of the semiconductor memory device of FIG. 1 with the upper interconnect layer removed, and FIG. 4 is a drawing that illustrates the operation of this semiconductor memory device.

These drawings show a semiconductor memory device that has a source region 111 formed in the shape of a band, a drain region 112 that is formed in the shape of a band and provided so as to oppose the source region 111, a first interconnect 103a which is provided on a layer above the source region 111 and which is connected to the source region 111, a second interconnect 103b, which is provided on a layer above the drain region 112, is connected to the drain region 112 and is provided on the same layer as the first interconnect 103a, and a third interconnect, provided on the same layer as the first and second interconnects, which is provided so as to laterally cross the above-noted source region 111 and drain region 112.

The above-noted semiconductor memory device further has a first contact region 10 that is provided with a plurality of contacts in the source/drain region on one side of the third interconnect 103c and a second contact region 20 that is provided with a plurality of contacts in the source/drain region on the other side of the third interconnect 103c. The source region 111 is connected via the contacts of the first contact region 10 to the first interconnect 103a, and the drain region 112 is connected via the contacts of the first contact region 10 to the second interconnect 103b. An interconnect layer 104 having a resistance value that is lower than the above-noted source/drain region is provided below the third interconnect 103c, along the source/drain region, the source region 111 of the first contact region 10 and the source region 111 of the second contact region 20 being connected by the interconnect layer 104 that has a resistance value lower than the source region 111, and the drain region 112 of the first contact region and the drain region 112 of the second contact region being connected by the interconnect layer 104 that has a resistance value lower than the drain region 112.

This embodiment of the present invention is described in further detail below.

The source/drain region 101, which is sandwiched between the field oxide film 90 has a region which will serve as the source region and the drain region. Specifically, the source region 111 and the drain region 112 will be formed within the source/drain region 101. The reference numeral 113 denotes a gate that is provided between the source region 111 and the drain region 112.

In the present invention, a lower interconnect 104, which is covered by an insulation film 93 and which is made of polysilicon doped with an impurity, is provided over the source region 111 and the drain region 112. The contact 106 is provided on top of this interconnect 104, a contact 105 being provided over the source region 111 and the drain region 112, a bit line aluminum filling, this serving as the upper interconnect 103a, being provided on these contacts 105 and 106.

Therefore, the source regions 111 of the plurality of transistors 107B in the second contact region 20 positioned below the lower interconnect layer 104 are connected via the lower interconnect layer 104 to the aluminum interconnects 103a, and in the same manner the drain regions 112 of the plurality of transistors 107B positioned below the interconnect layer 104 are connected via the lower interconnect layer 104 to the aluminum interconnects 103b. Because the interconnect 104 is made of polysilicon that is doped with an impurity, even in plurality of transistors 107B at the ends of the source region 111 and drain region 112 of the second contact region 20, the prescribed voltage is supplied to the transistors 107B via the interconnect 104, so that there is no loss of capacity of the transistors 107B in this region.

Naturally, it is clear that there is no loss of capacity of the plurality of transistors 107A at the end of the first contact region 10. In the plurality of transistors 107C, located at the end of the second contact region 20, there is only a small voltage drop because of the interconnect 104, so that there is no loss of capacity of these transistors as well.

By adopting the above-described configuration, even in the case in which it is possible to provide a contact for connection between the upper interconnect layers 103a, 103b and the source, drain regions 111, 112, respectively, over only half or less of the overall gate width W, because of the low resistance of the lower interconnect 104, the voltage drop in the voltage supplied to the transistors 107B and 107C is small, so that transistors over the entire region are able to exhibit sufficient capacity.

The above effect is described below, with reference to FIG. 4.

The left part of FIG. 4 shows just one gate removed from the semiconductor memory device, and the right side of FIG. 4 shows an equivalent representation thereof. The potential at the upper interconnect 103a is led to the diffusion layer of the first contact region 10 by the contact 105a, and to the interconnect 104 by the contact 106, this being again led to the second contact region 20 by the contact 106 and, via the contacts 105c and 105d, to the diffusion layer of the second contact region 20.

By means of the lower interconnect 104, compared with the prior art, transistors that are at a distance equivalent to the resistance of r1 from the contacts 105a, 105b, 106, 105c, and 105d operate normally. In this case, a transistor located in the part marked "x" in the drawing does not operate normally.

Figure 5:
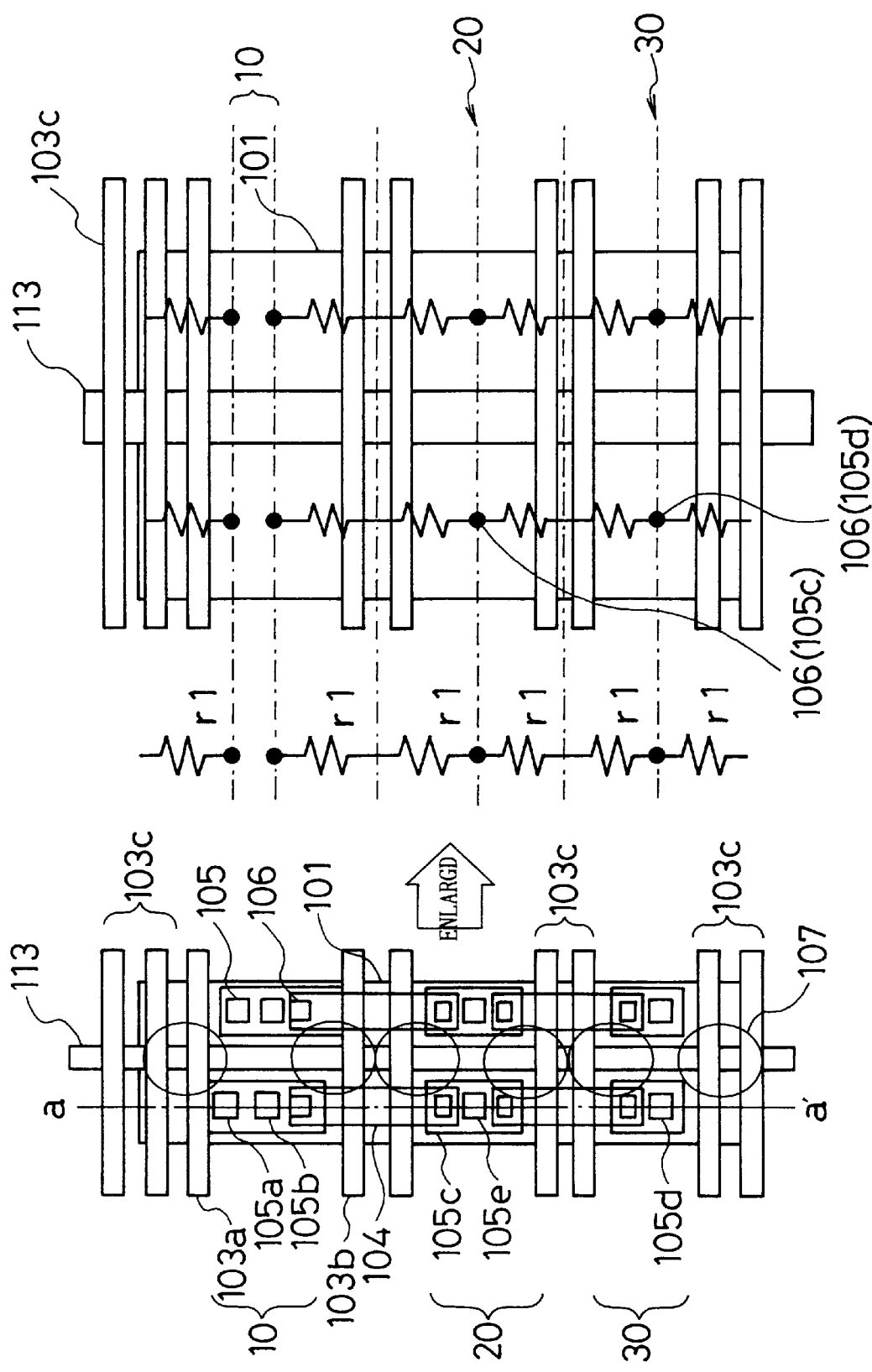
FIG. 5 is a drawing that illustrates the operation of the second embodiment of the present invention.
Figure 6:
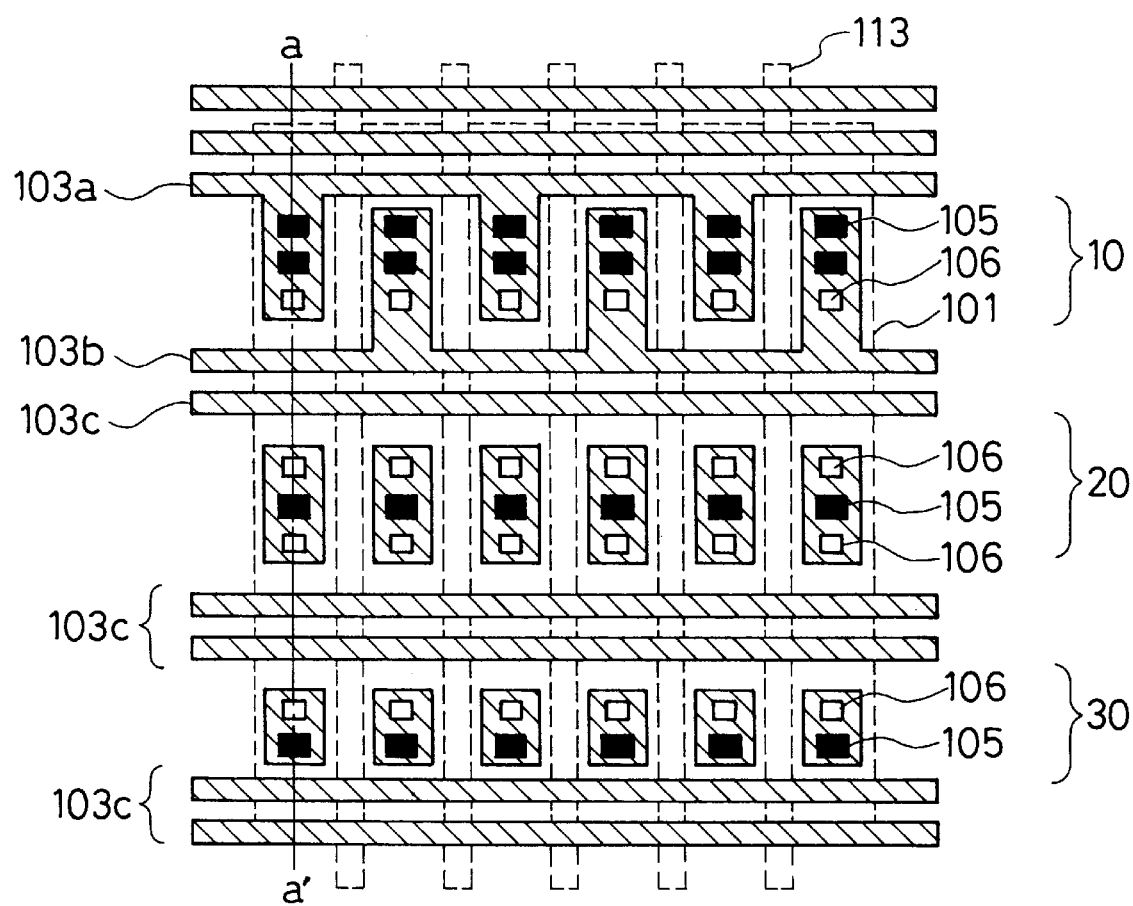
FIG. 6 is a drawing that shows the condition of the upper interconnect layer of the second embodiment of the present invention.
Figure 7:
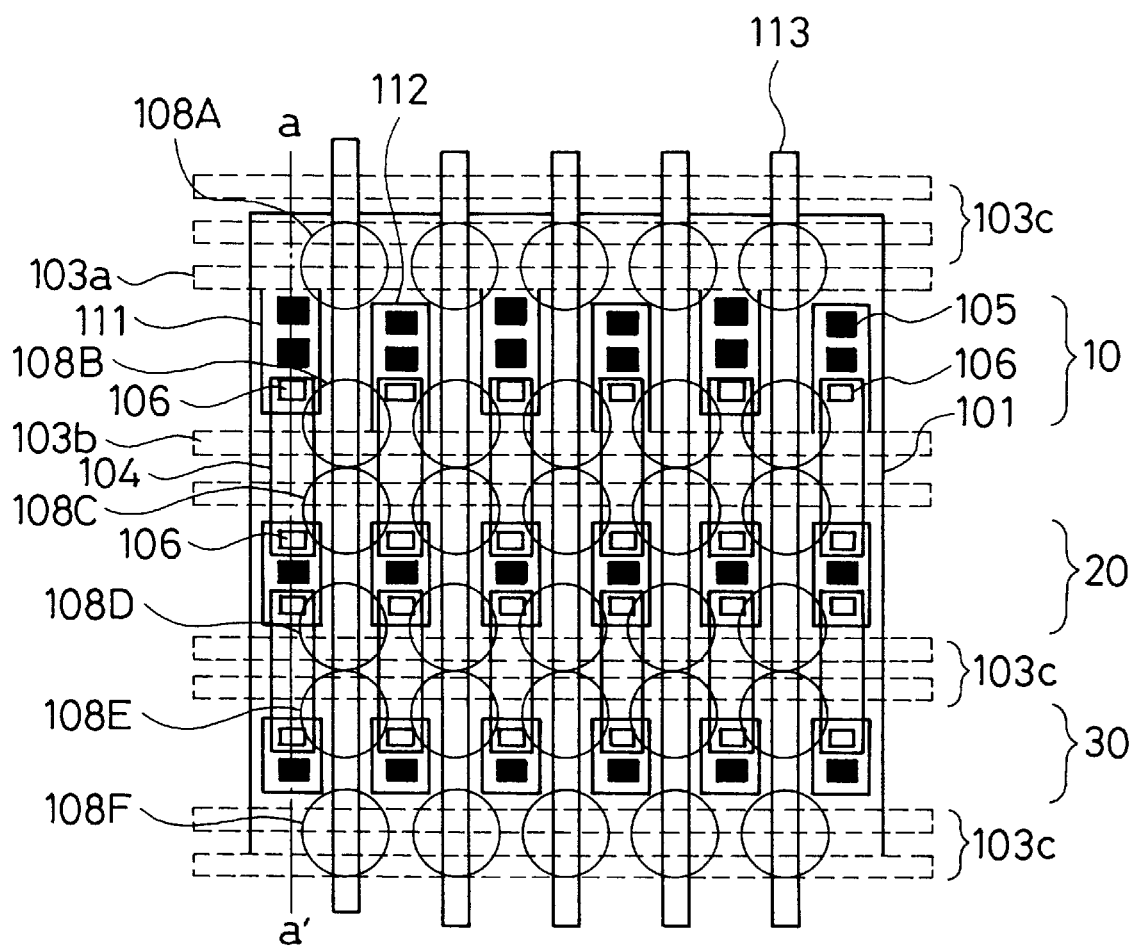
FIG. 7 is a plan view that shows the second embodiment of the present invention with the upper interconnect layer of FIG. 6 removed.

FIG. 5 through FIG. 7 show the structure of the second embodiment of a semiconductor memory device according to the present invention, FIG. 5 illustrating the operation thereof, FIG. 6 being a plan view that shows the condition of the upper interconnect, and FIG. 7 being a drawing that shows the device with the upper interconnect removed.

In the second embodiment an improvement is provided which enables transistors in the above-noted part marked "x" to operate normally. Specifically, the contact region is divided into three regions, a first contact region 10, a second contact region 20, and a third contact region 30, these contact regions being connected by means of a plurality of lower interconnect layers 104, so that the resistance of all transistors over the entire width W is within the resistance value r1, the result being that the degree of integration can be increased.

It will be obvious to the reader skilled in the art that it is also possible to divide the contact region into more than three sub-regions.

Figure 8:
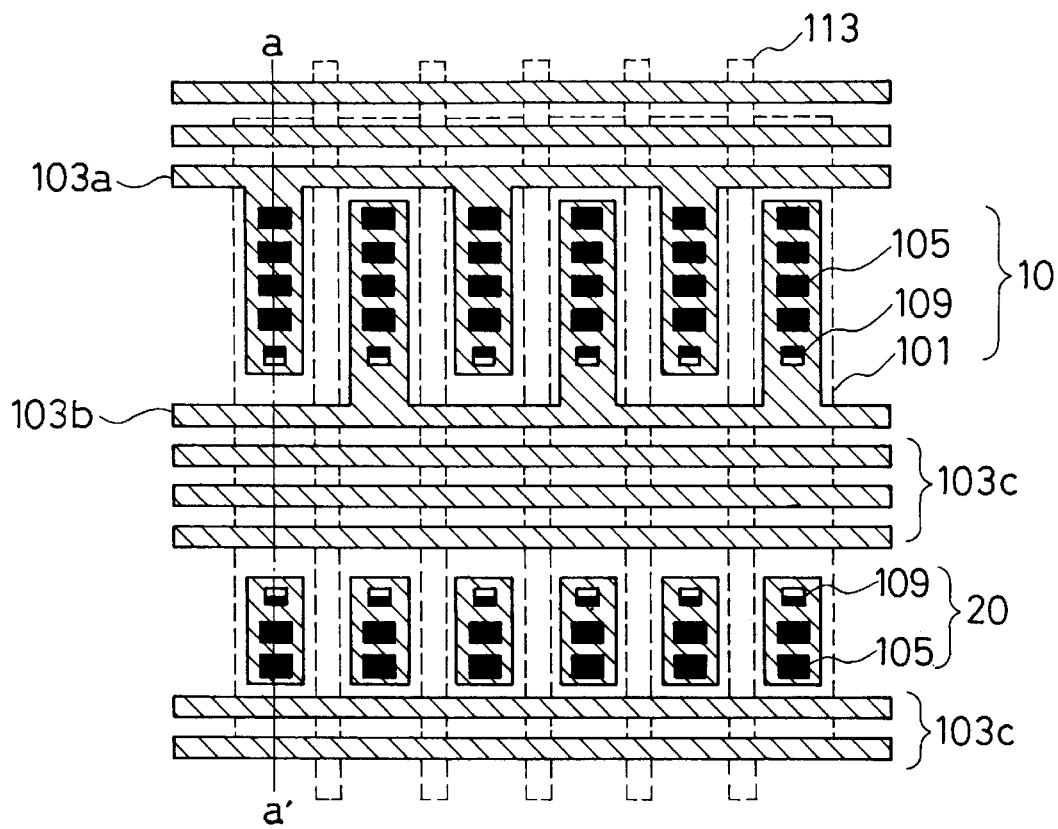
FIG. 8 is a plan view of the third embodiment of a semiconductor memory device according to the present invention, that shows the condition of the upper interconnect layer thereof.
Figure 9:
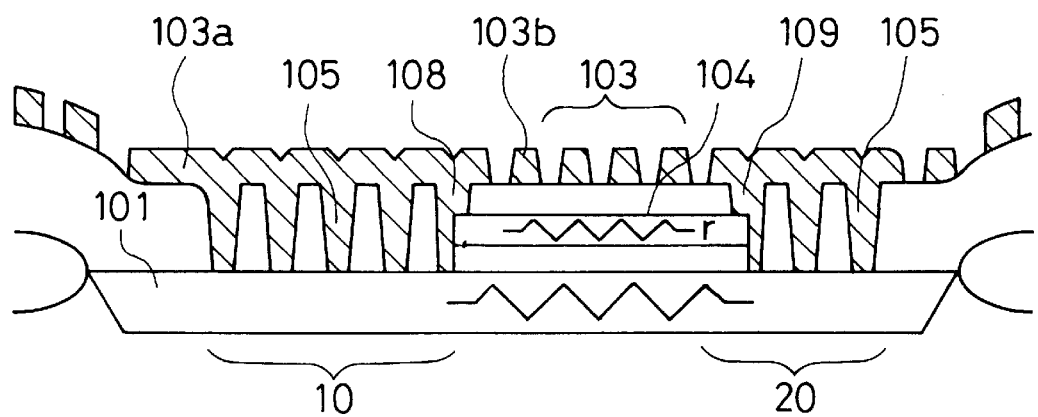
FIG. 9 is a cross-section view of the third embodiment.
Figure 10:
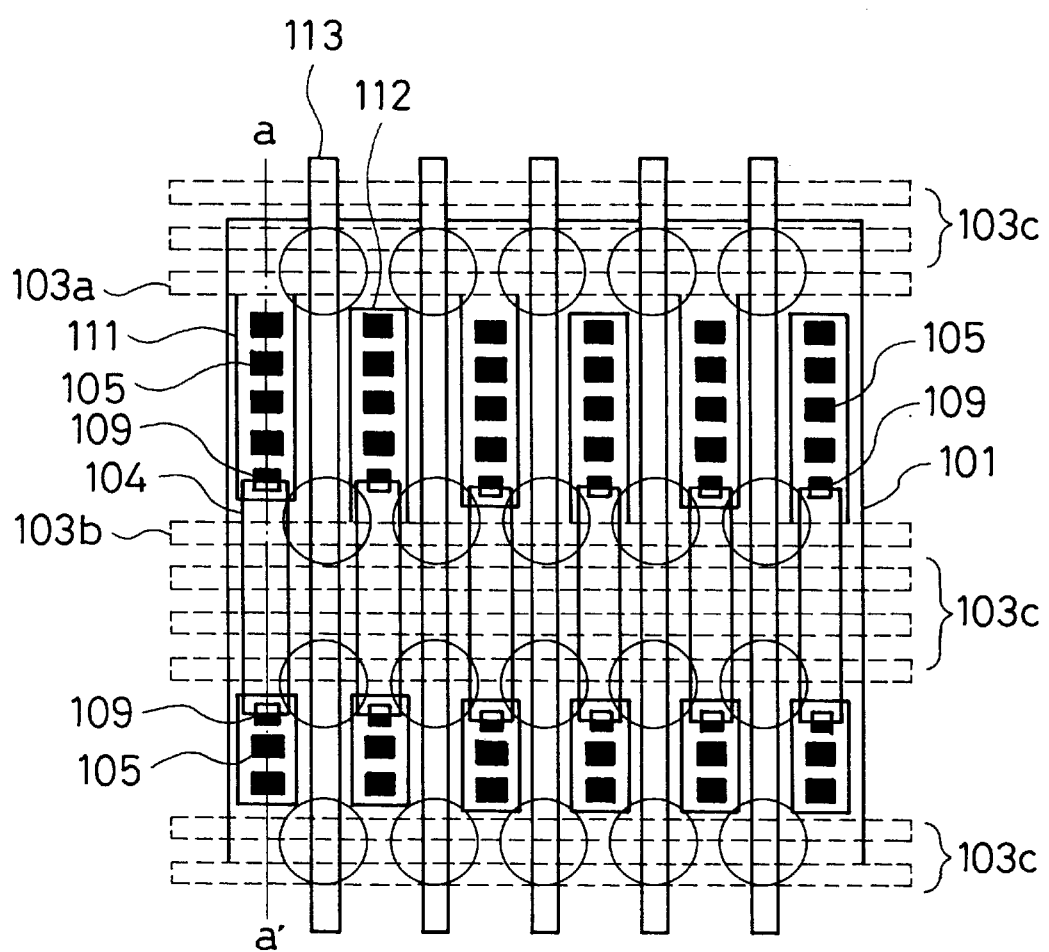
FIG. 10 is a drawing that shows the third embodiment of FIG. 8 with the upper interconnect layer removed.

FIG. 8 through FIG. 10 show the structure of the third embodiment of a semiconductor memory device according to the present invention, FIG. 8 being a plan view of the condition of the upper interconnect, FIG. 9 being a cross-section view along the cutting line a—a' shown in FIG. 8, and FIG. 9 being a drawing that shows the device with the upper interconnect removed.

In this embodiment, the source region 111 (or drain region 112) and the upper interconnect layer 103a (or 103b) that is provided on the above-noted source region 111 (or drain region 112) are connected via the contact 109 that is provided on the source region 111 (or drain region 112), and the upper interconnect layer 103a (or 103b) and the lower interconnect layer 104 are connected via the contact 109. The upper interconnect layer 103a (or 103b), lower interconnect layer 104 and the source region 111 (or drain region 112) are connected via a single contact 109.

Figure 11:
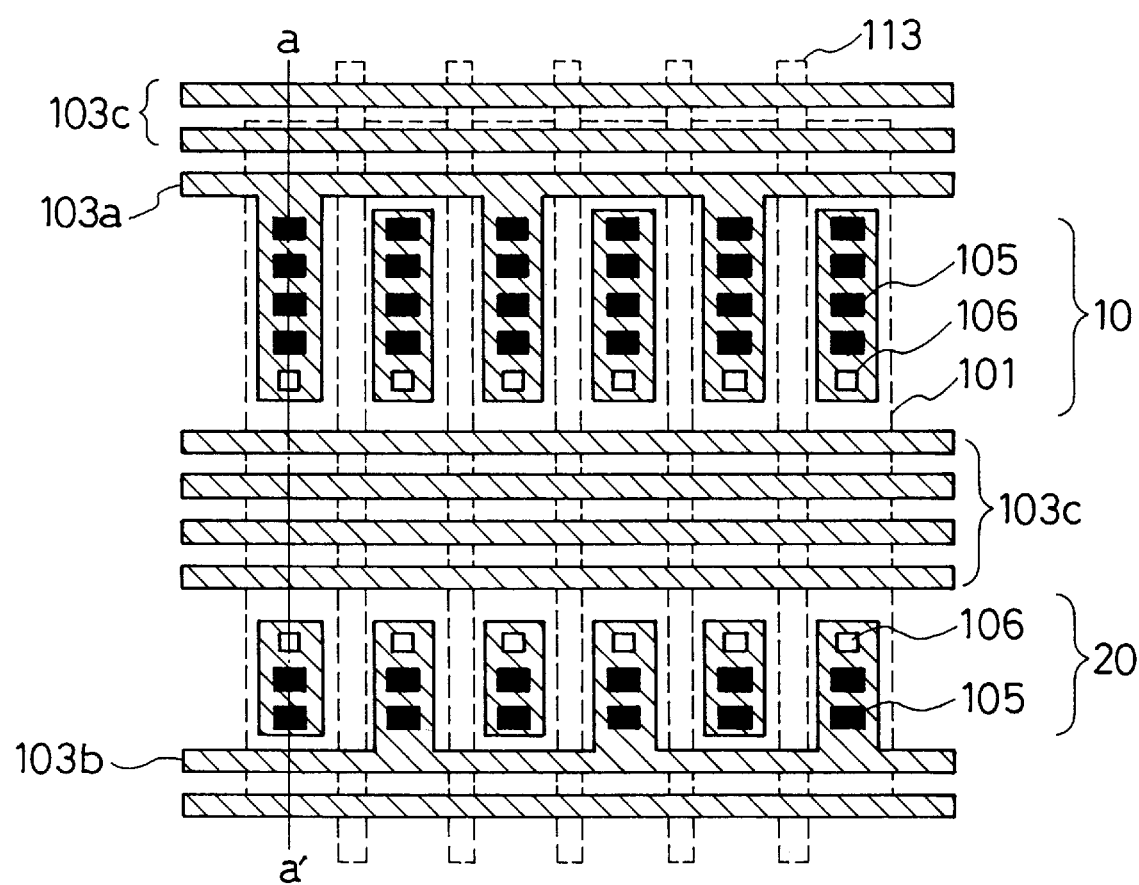
FIG. 11 is a plan view that shows the condition of the upper interconnect layer of the fourth embodiment of the present invention.
Figure 12:
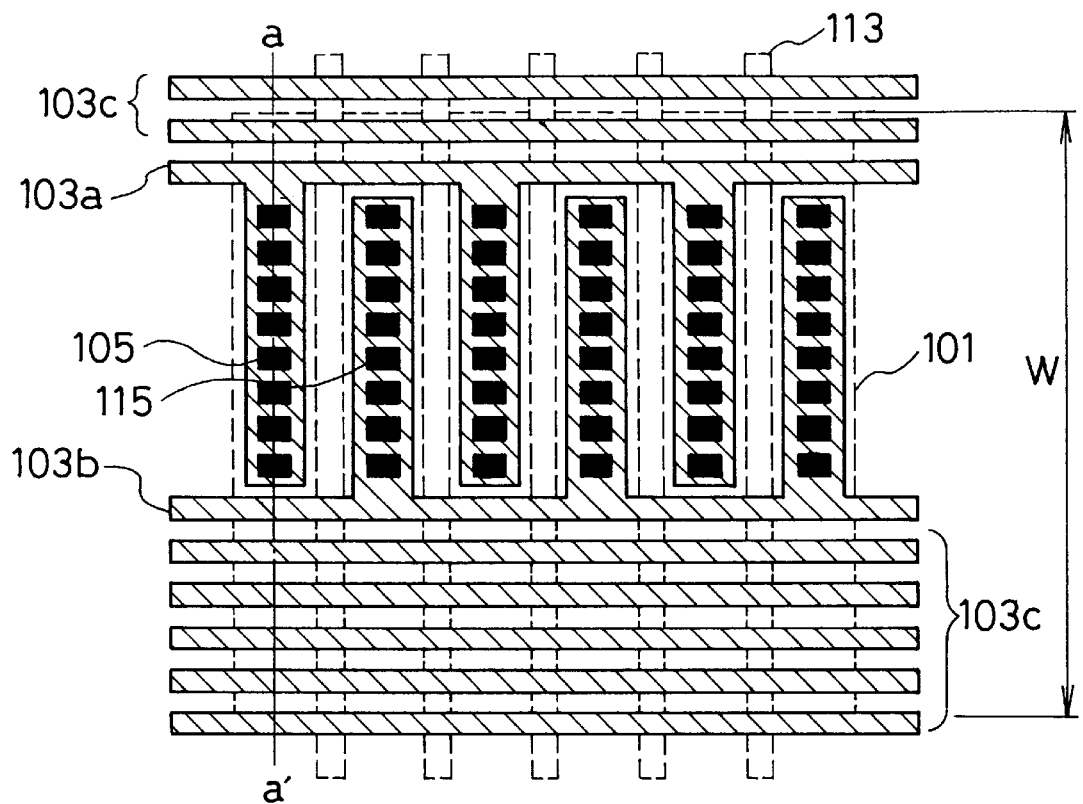
FIG. 12 is a plan view of a semiconductor memory device of the prior art, that shows the condition of the upper interconnect layer thereof.
Figure 13:
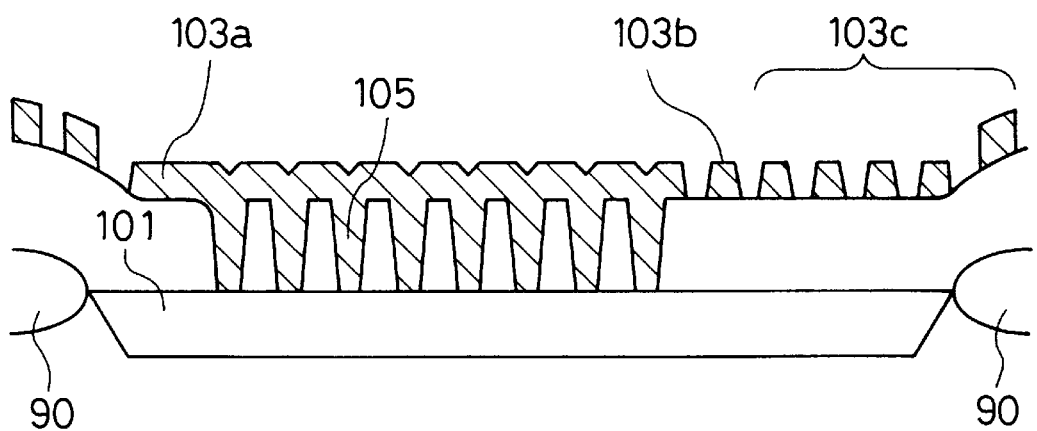
FIG. 13 is a cross-section view thereof.
Figure 14:
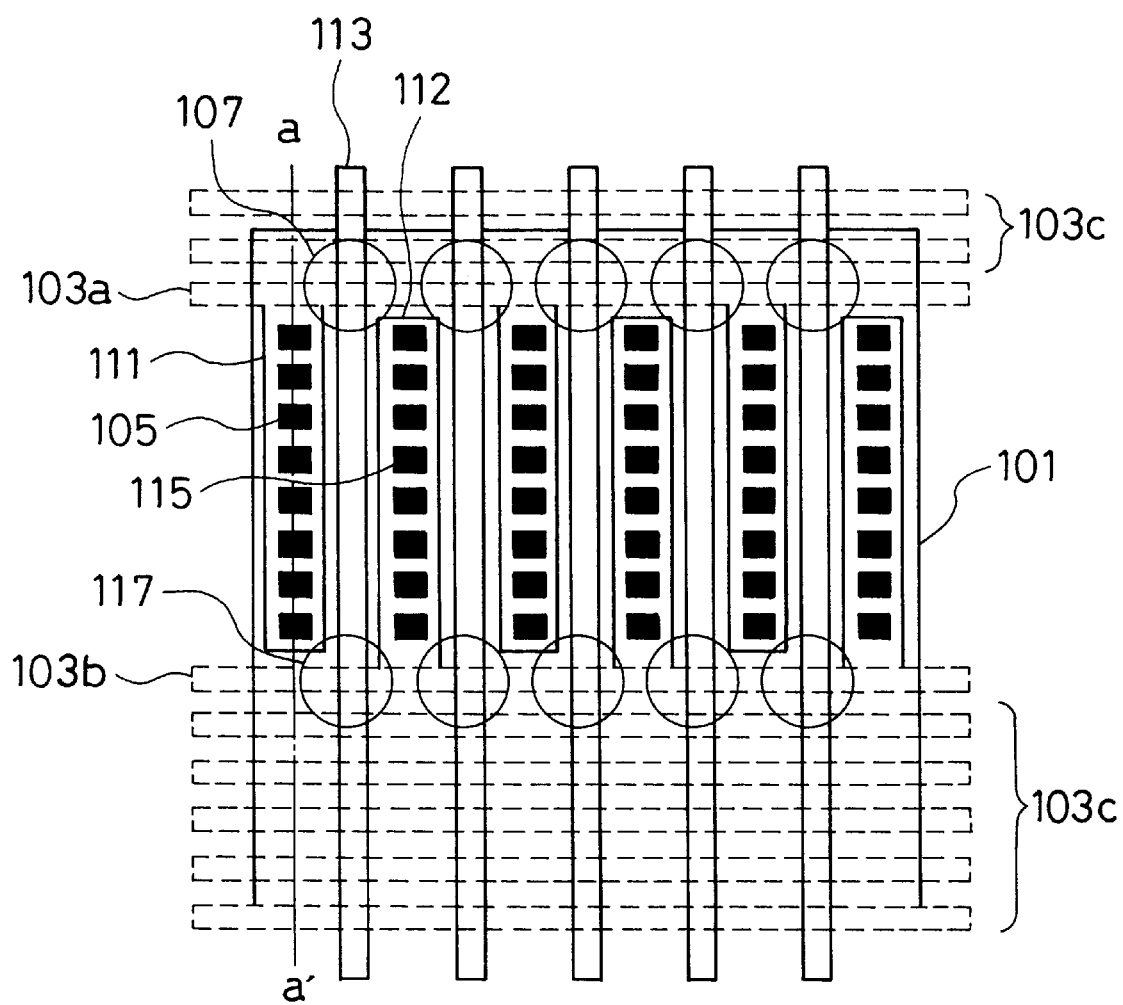
FIG. 14 is a drawing that shows the condition of the upper interconnect layer of the prior art.

FIG. 11 shows the fourth embodiment of the present invention, which is a variation of the first embodiment, in which the upper interconnect layer 103a is connected to a source of the first contact region 10, and in which the upper interconnect layer 103b is connected to a drain in the second contact region 20.

By adopting the above-described constitution, according to the present invention, in contrast to the prior art, there is no significant loss of capacity in transistors that are located at the end of the drain/source region at a distance from the upper interconnect, making it possible to not only increase the level of integration, but also reduce the influence of parasitic resistance in the source and drain regions, thereby increasing the speed of data writing.

What is claimed is:

1. A semiconductor memory device comprising:

a source region formed in the shape of a band;

a drain region formed in the shape of a band in opposition to said source region;

a first interconnect which is provided in a layer above said source region and which makes connection thereto;

a second interconnect which is provided in a layer above said drain region, which makes connection thereto and which is provided on the same layer as said first interconnect; and a third interconnect, which is provided on the same layer as said first and second interconnects and which is provided so as to laterally cross said source and drain regions, this semiconductor memory device further comprising:

a first contact region that is provided with a plurality of contacts in said source/drain region on one side of said third interconnect, and a second contact region that is provided with a plurality of contacts in said source/drain region on the other side of said third interconnect, said source region being connected via the contacts of said first contact region to said first interconnect, and said drain region being connected via the contacts of said first contact region to the second interconnect; and an interconnect layer having a resistance value that is lower than said source/drain region is provided below the third interconnect, along said source/drain region, said source region of said first contact region and said source region of said second contact region being connected by said interconnect layer having a lower resistance value than said source region, and said drain region of said first contact region and said drain region of the second contact region being connected by said interconnect layer having a lower resistance than said drain region.

2. A semiconductor memory device comprising:

a source region formed in the shape of a band;

a drain region formed in the shape of a band in opposition to said source region;

a first interconnect which is provided in a layer above said source region and which makes connection thereto;

a second interconnect which is provided in a layer above said drain region, which makes connection thereto and which is provided on the same layer as said first interconnect; and a third interconnect, which is provided on the same layer as said first and second interconnects and which is provided so as to laterally cross said source and drain regions, this semiconductor memory device further comprising:

a first contact region that is provided with a plurality of contacts in said source/drain region on one side of said third interconnect, and a second contact region that is provided with a plurality of contacts in said source/drain region on the other side of said third interconnect, said source region being connected via the contacts of said first contact region to said first interconnect, and said drain region being connected via the contacts of said second contact region to the second interconnect; and an interconnect layer having a resistance value that is lower than said source/drain region is provided below the third interconnect, along said source/drain region, said source region of said first contact region and said source region of said second contact region being connected by said interconnect layer having a lower resistance value than said source region, and said drain region of said first contact region and said drain region of the second contact region being connected by said interconnect layer having a lower resistance than said drain region.

3. A semiconductor memory device according to claim 1, wherein a plurality of said contact regions is provided, said contact regions being connected each other by an interconnect layer that has a resistance value that is smaller than that of said source/drain region.

* * * * *